United States Patent
Swart

[11] Patent Number: 5,389,885
[45] Date of Patent: Feb. 14, 1995

[54] EXPANDABLE DIAPHRAGM TEST MODULES AND CONNECTORS

[75] Inventor: Mark A. Swart, Upland, Calif.

[73] Assignee: Everett Charles Technologies, Inc., Pomona, Calif.

[21] Appl. No.: 9,133

[22] Filed: Jan. 26, 1993

Related U.S. Application Data

[63] Continuation-in-part of Ser. No. 827,023, Jan. 27, 1992, Pat. No. 5,252,916.

[51] Int. Cl.⁶ .............................................. G01R 1/073
[52] U.S. Cl. ..................................... 324/761; 324/754
[58] Field of Search ............... 324/158 F, 158 P, 72.5, 324/761, 757, 754

[56] References Cited

U.S. PATENT DOCUMENTS

| | | | |
|---|---|---|---|
| 3,016,489 | 1/1962 | Briggs et al. | 324/158 |
| 3,714,572 | 1/1973 | Ham et al. | 324/158 |
| 4,061,969 | 12/1977 | Dean | 324/158 P |
| 4,115,735 | 9/1978 | Stanford | 324/158 |
| 4,232,928 | 11/1980 | Wickersham | 339/117 |
| 4,340,858 | 7/1982 | Malloy | 324/158 P |
| 4,963,821 | 10/1990 | Janko et al. | 324/158 P |
| 4,968,931 | 11/1990 | Littlebury et al. | 324/158 P |
| 5,049,813 | 9/1991 | Van Loan et al. | 324/158 F |
| 5,055,778 | 10/1991 | Okubo et al. | 324/158 P |

FOREIGN PATENT DOCUMENTS

| | | | |
|---|---|---|---|
| 2465231 | 4/1981 | France | 324/158 P |

Primary Examiner—Ernest F. Karlsen
Attorney, Agent, or Firm—Christie, Parker & Hale

[57] ABSTRACT

A test module tests integrated circuit (IC) packages mounted on a loaded printed circuit board (PCB) by first placing the module over the package. Each module has rows of test probes for electrically contacting corresponding electrical leads on the IC package. Solid test probes are mounted in a housing in the test module so that electrical connection is achieved between the probes and a flexible printed circuit board that communicates electrical test signals from an external circuit test analyzer to the probes. A thin, flexible elastic diaphragm is mounted across the ends of the test probes so that the diaphragm is elastically movable away from the housing in response to axial pressure from the test probes being pressed against the leads of the IC package. The diaphragm stretches and thereby provides a spring force against the test probes. The test module is used in test fixtures by mounting the test modules in a probe plate spaced from IC packages to be tested. Other test probes, such as spring probes, are mounted in the probe plate in a pattern corresponding to other test points on the board under test. Another embodiment provides a connector interface in which a flexible diaphragm on the interface provides spring biased pressure for test pins covered in the module and which are electrically connected to terminals on the module. The pins and the terminals provide interface connections between a pair of separate current devices.

13 Claims, 4 Drawing Sheets

EXPANDABLE DIAPHRAGM TEST MODULES AND CONNECTORS

CROSS REFERENCE TO RELATED APPLICATION

This is a continuation-in-part of application Ser. No. 07/827,023, filed Jan. 27, 1992, now U.S. Pat. No. 5,252,916, the subject matter of which is incorporated herein by this reference.

FIELD OF THE INVENTION

This invention relates to the testing of circuit elements mounted on printed circuit boards, and more particularly, to the testing of integrated circuit packages, such as plastic leaded chip carrier (PLCC) packages, mounted on loaded printed circuit boards, using an elastic diaphragm for applying a spring force against test probes.

BACKGROUND OF THE INVENTION

Circuit board test systems are used to test large numbers of printed circuit boards by verifying electrical functionality and continuity between various test points on the circuit board. Continuity and lack of continuity are generally detected through the use of test fixtures having an array of test probes for making electrical contact with individual test points on the printed circuit board. Test systems vary in their approach to bringing the array of test probes into contact with the test points on the circuit board. One test system for testing loaded circuit boards includes spring-biased test probes mounted on a probe plate in a vacuum-actuated test fixture for applying pressure between the spring probes and the circuit board test points. The test system also includes a test analyzer which generally includes a computer controlled detection system for applying electrical test signals to selected contacts to sense continuity and provide test results. An example of a prior art test system is described in Long, et al. U.S. Pat. No. 4,138,186.

Loaded printed circuit boards are usually crowded with various electrical components including arrays of integrated circuit packages. These packages typically include integrated circuits packaged in an insulated housing with a plurality of thin, parallel electrical leads extending from the housing. The leads from the integrated circuit package can be bent into various configurations which can make testing of the packages difficult. For instance, integrated circuit packages with "J-lead" or "gull wing" lead configurations are common. It is also common to mount large numbers of these integrated circuit packages close to one another on the circuit board to save board space. If a number of integrated circuit packages are crowded together on a loaded circuit board, there is usually little room left around the integrated circuit packages for making electrical contact between spring probes on a test unit and leads on the circuit packages or other circuit elements adjacent to the packages.

Semiconductor chips are often produced in various packages. One type of package is a dual-in-line (DIP) package having two sets of spaced apart leads extending along opposite sides of the package. A second method of packaging uses surface mount packaging technology which packs electronic functions more densely on circuit boards. One common form of surface mount packaging is the so-called plastic leaded chip-carrier (PLCC) package. Generally speaking, PLCC packages house memory and microprocessor integrated circuit chips requiring large numbers of leads spaced apart along all four sides, or at least along two opposite sides of a rectangularly shaped housing. Because of their small size and large number of leads, it is difficult to test multiple arrays of closely spaced apart PLCC devices mounted on loaded printed circuit boards. The configuration of the leads also makes it difficult to test PLCC devices. In some integrated circuit packages, the lead configuration prevents contact being made between the leads and the test probes of the test unit, for instance, the packages with leads in a gull wing configuration. The solder joints are sensitive to external pressure and therefore contact with spring biased test probes should be avoided to prevent fracturing the solder joints.

Translator modules for testing such integrated circuit packages are described in Van Loan, et al. U.S. Pat. 5,049,813 (the '813 patent herein), the subject matter of which is incorporated herein by this reference. The '813 patent shows a translator module mounted over an integrated circuit package on a loaded circuit board. The translator module includes rows of spaced apart contacts for making contact with corresponding rows of leads adjacent a circuit package. In one embodiment, an array of test pads on a top side of a module are contacted by individual test probes of a circuit continuity test analyzer. Electrical contact between the leads associated with the circuit package and corresponding contacts on the module is translated to the test probes for use in verifying electrical connections between the circuit package and circuit elements on the printed circuit board.

In one embodiment of the '813 patent, the contacts on the test housing are arranged for independent releasable spring biased contact with corresponding leads on the integrated circuit package. In another embodiment, the module is made from a "flex-circuit" material so that the contacts each comprise a thin metal film on a flexible plastic backing sheet, in which the contacts have a memory for producing rows of spring-like contact fingers along the side edges of the module. In other forms of the test module, the spring probes or flex circuit fingers may be arranged to contact corresponding test points or pads on the printed circuit board adjacent the leads on the IC package.

As circuit board and integrated circuit technologies advance, circuit components are more closely spaced. The test points and probes for such circuits necessarily must be more closely spaced, requiring smaller probes and smaller probe components such as springs which become more difficult and expensive to make.

Thus, there is a need to provide a means for testing loaded printed circuit boards having large numbers of integrated circuit packages mounted close to one another on the board where the circuit packages have leads closely spaced to one another. The test system must be adaptable to the closer spacings while providing extremely accurate and reliable test measurements. The need for such a test system is especially critical because of the expanding use of the surface mount packages such as PLCC devices which are particularly difficult to test. PLCC devices in particular can be difficult to test with a conventional test head because the PLCC package can easily become skewed from a squared position relative to the circuit board, or because of the need to avoid pressure contact between the leads on the IC package and the test unit. There is also a need for a test system that does not cause undue delays during testing and is adaptable readily to testing circuit boards having multiple integrated circuit packages mounted in various patterns on different boards. In addition, the test system should be reasonably inexpensive to manufacture and highly reliable during use.

SUMMARY OF THE INVENTION

Briefly, one embodiment of the invention provides a test module for making contact with an array of spaced apart leads on an integrated circuit package mounted among other electrical circuit elements on a loaded printed circuit board, to perform circuit verification by an external electronic test analyzer. The test module has a rigid probe housing having a plurality of elongated and spaced apart test probes each extending through respective bores in the housing, to support the probes in a pattern corresponding to that of the leads of the integrated circuit package. A first end of each supported test probe is aligned for contact with a corresponding lead on the integrated circuit package. An opposite second end of each supported test probe faces away from the integrated circuit package. A flexible elastic diaphragm is mounted on a top side of the probe housing so that the diaphragm is normally held in contact with the top side of the probe housing opposite from the integrated circuit. The diaphragm thereby contacts the second ends of the moving test probes so that the diaphragm is elastically movable away from the housing in response to axial pressure contact from the second ends of the test probes when the test module is mounted over the integrated circuit. The test module further includes means for electrically connecting the test probes to corresponding terminals on the test module so that contact between the individual leads adjacent the integrated circuit package and corresponding test probes on the module is electrically translated from the terminals to test circuits in the external electronic test analyzer.

In preferred embodiments, the test module has a conductive barrel in each bore. The test probes are solid metal pins in sliding contact with the barrels. The terminals comprise a flex circuit bonded to the top site of the probe housing and having circuit traces communicating with corresponding test probes. The circuit traces on the flex circuit extend away from the probes into a peripheral region of the probe housing for transmitting test signals to the external circuit tester.

In one embodiment, a rigid housing cover is mounted against a second face of the diaphragm. The cover has a cavity above the test probes. The cover holds the diaphragm so that it moves into the cavity when it elastically moves away from the housing.

The invention provides a high density test module with controlled resilient pressure applied to the module and by the module in high densities and with contacts that avoid more complex spring contacts or internal wiring to complete translation of test signals through the module between the test probes and the circuits on the board.

These and other aspects of the invention will be fully understood by referring to the following detailed description and the accompanying drawings.

DETAILED DESCRIPTION

Figure 1:
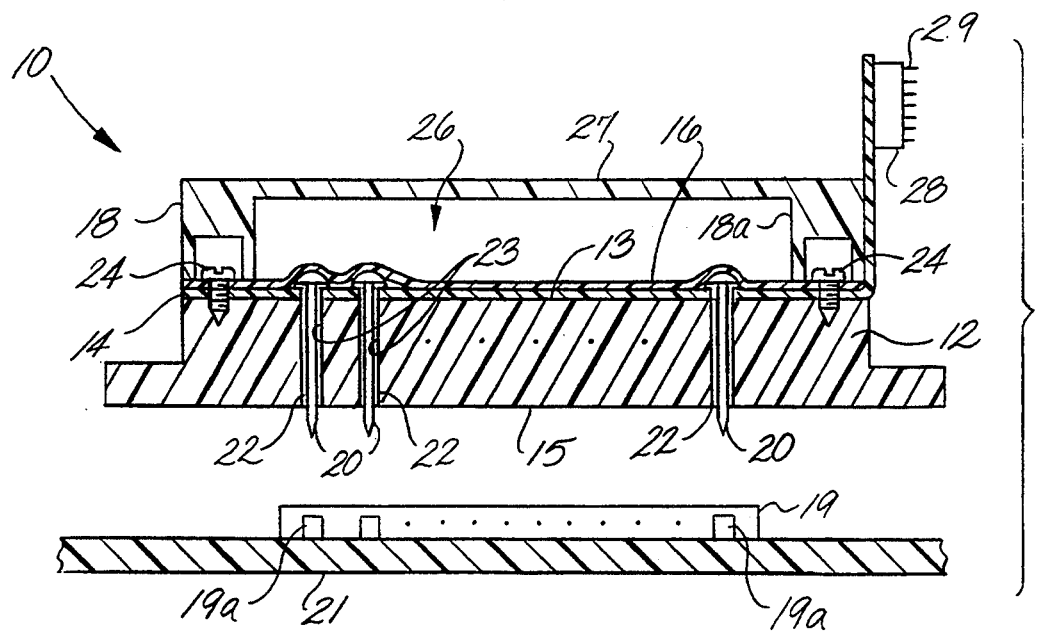
FIG. 1 is a cross sectional view taken on line 1—1 of FIG. 2 illustrating a translator module according to principles of this invention in a testing position above an integrated current package under test.
Figure 2:
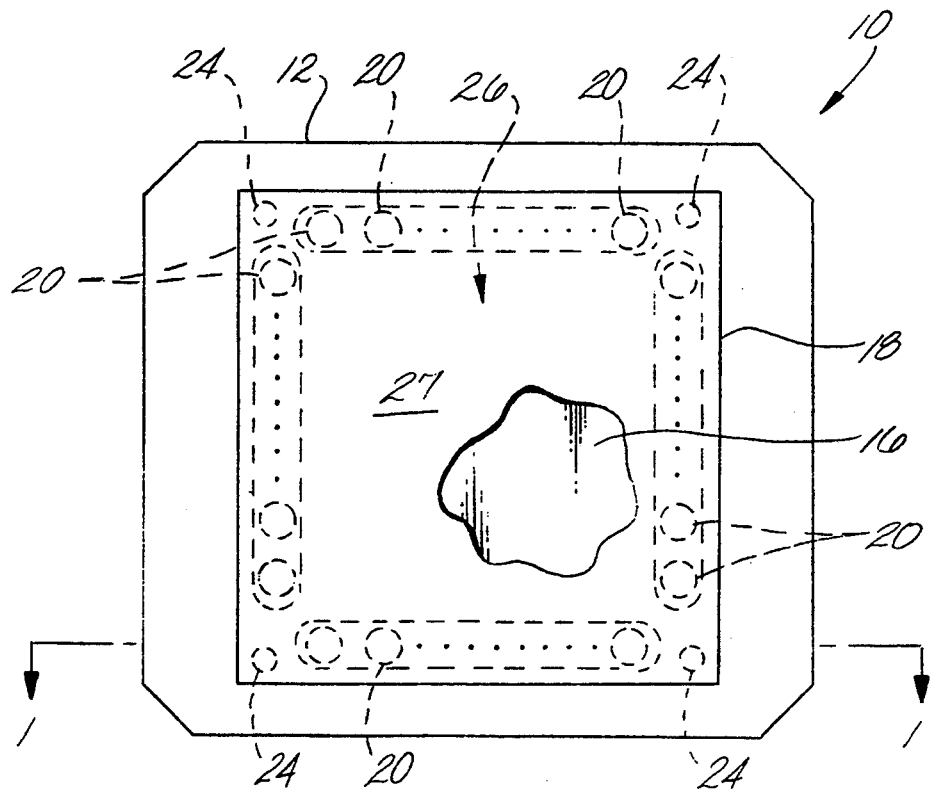
FIG. 2 is a top plan view, partly broken away, showing the translator module of FIG. 1.

FIG. 1 is a cross sectional view illustrating a translator module 10 according to the principles of this invention. FIG. 2 is a top plan view of the translator module. The translator module 10 (also referred to as a test module) comprises a housing 12 having a flat upper surface 13 and a parallel flat bottom surface 15; a thin, flat flex circuit 14 overlying the upper surface 13 of the housing; a thin, flexible elastomeric diaphragm 16 held under tension and overlying the flex circuit 14; a cover 18 mounted to the top of the housing over the diaphragm 16; and a plurality of test probes 20 supported by the housing 12 and movable toward the stretchable diaphragm 16. The probes normally project below the bottom face 15 of the housing. The housing 12 is a solid unitary piece made of a sturdy, rigid electrically insulating material, such as G-10 fiberglass. During use of the translator module, the housing 12 is mounted over an integrated circuit package 19 carried on a printed circuit board 21. The circuit board mounts various electrical components, including resistors, capacitors, inductors, and integrated circuits, together with electrical circuit traces for conducting electrical signals between the components on the circuit board. The circuits on the board also can reduce test points for contact with test probes for use in testing circuit continuity as described below.

The integrated circuit 19 to be tested can be packaged in a plastic leaded chip carrier (PLCC) package. As noted above, PLCC packages have leads spaced apart along all four sides, or at least along two opposite sides of a rectangularly shaped housing. Alternatively, the integrated circuit package may be a dual-in-line (DIP), J-lead, or gull wing package, for example. A row of leads 19a is shown along one side of the integrated circuit on FIG. 2 by way of example.

The housing 12 has a plurality of separate bores 23 drilled through the depth of the housing 12 for opening to both sides of the housing. The bores 23 are drilled in a fixed pattern corresponding to the fixed pattern of the leads on the integrated circuit package 19 to be tested. As illustrated in FIGS. 1 and 2, this pattern of bores is drilled in rows of uniformly spaced apart holes in a square pattern along the length and width of the housing.

A separate electrically conductive barrel 22 (also referred to as an eyelet) is press fitted into each bore. Separate test probes 20 are slidably mounted in each of the barrels 22. The test probes are movable axially in their respective barrels 22 freely and under gravity. The test probes 20 slide on the inside of the barrels 22 for making sliding electrical contact within the barrels.

The test probes 20 have a sharp tip on one end and a hemispherical head on the other end. The test probes 20 are preferably solid metal pins. The test probes 20 are mounted in the barrels so that the probes normally project away from the bottom face of the housing. Each probe tip extends toward the integrated circuit 19 under test, while the hemispherical heads or the probes face toward the top side of the housing 12. (Only a few of the test probes, which can be several hundred in number, are shown in FIG. 1 for clarity. Components of the translator module 10 and the probes also are shown exaggerated in size or disproportionate in relative size also for clarity.)

The flex circuit 14 (also referred to as a flexible printed circuit board) is laminated to the top surface 13 of the housing 12. The flex circuit 14 comprises a thin flexible film sheet of an electrically insulating material which supports a pattern of electrically conductive circuit traces typically made of copper bonded to the film. Each barrel 22 has an outer flange that pierces a circuit trace and seats the flange to the circuit trace to form an electrical connection. The flex circuit 14 contains electrically conducting paths or traces for communicating electrical signals from the barrel 22 to an external electronic tester (not shown).

The preferred flex circuit 14 sheet material is a thin, self-supporting thermoplastic film such as Mylar. In one embodiment, multiple layers of Mylar and copper circuit traces can be bonded together to form a multiple layer flex circuit 14. The flex circuit 14 is laminated to the top surface 13 of the housing 12 by suitable adhesives or other means of bonding the plastic sheet to the housing. As shown in FIG. 1, the flex circuit 14 is freely wrapped upwardly around one side of the housing cover 18 to extend above the top of the cover 18. A connector 28 is bonded to a portion of the flex circuit that extends above the cover. Circuit traces in the flex circuit are electrically connected to pins 29 in the connector 28. Alternatively, the traces may be terminated by larger copper pads for electrical connections thereto. For example, the flex circuit 14 may be folded over and laminated to a top surface 27 of the cover 18. In this example, the large copper pads are arranged in an array such as a uniformly spaced apart grid pattern on the surface of the flex circuit that faces upwardly from the top of the cover. The copper pads are electrically contacted by test probes in a manner similar to that disclosed in the '813 patent referred to previously.

The thin, flexible elastomeric diaphragm 16 is stretched against the top surface of the flex circuit 14 so that the bottom face of the diaphragm is in contact with the hemispherical heads of the test probes 20. The diaphragm 16 is made from an elastically stretchable nonporous material such as natural rubber or a synthetic elastomer such as neoprene rubber. The thin, flexible diaphragm 16 is stretchable longitudinally (in the plane of the rubber sheet). The diaphragm is also stretchable in a direction perpendicular to the plane of the rubber sheet, under forces applied toward the diaphragm.

The diaphragm 16 is attached on one end to the housing 12 by hold-down screws 24. The diaphragm 16 is drawn tautly across the top surface of the flex circuit 14 and is attached on its other end to the housing 12 by further hold-down screws 24. The bottom surface of the stretched elastic diaphragm 16 is thereby normally held taut against the heads of the test probes 20. The diaphragm 16 is secured to the housing 12 by the hold-down screws inserted into tapped holes located in each corner on the top surface of the housing 12. The lid or housing cover 18 has a downwardly projecting rectangular peripheral flange 18a mounted against a peripheral top surface of the diaphragm 16. A downwardly facing cavity 26 in the bottom surface of the lid faces toward the rows of probes to provide an internal hollow interior region into which the rubber diaphragm and probes can deflect during use.

In an alternate embodiment, the diaphragm 16 is bonded at its periphery to the top surface 13 of the housing 12 so that the diaphragm is tautly disposed against the heads of the test probes. This embodiment may optionally have no housing cover 18.

The diaphragm 16 being held under tension applied within the plane of the diaphragm is held taut against the top face of the flex circuit 14 as well as the hemispherical heads of the test probes 20. When the diaphragm is held against the flex circuit, it provides a uniform spring force (in the plane of the diaphragm and depthwise, perpendicular to the face of the diaphragm) across the surface of the diaphragm. Test probes 20 moving into the diaphragm 16 to displace it are resisted by an equal and opposite axial force generated by the flexible stretched diaphragm.

More specifically, during testing, the tips of the test probes 20 are pressed against the leads 19a of the integrated circuit package 19. Alternatively, the test probes may be pressed against circuit traces on the circuit board adjacent to and in electrical contact with the leads on the integrated circuit package. The head of each test probe is urged, in response to the axial force on the probe, into the diaphragm 16 to thereby elastically stretch the diaphragm 16 away from the housing and into the cavity 26 of the cover 18. The elastic stretching of the diaphragm 16 causes the diaphragm 16 to try to elastically shrink to return toward a less stretched condition. The elastic shrinking provides an equal counterforce or spring biasing force against the test probes to thereby apply a separate and independent axial spring force perpendicularly against each lead of the integrated circuit package contacted by a corresponding spring biased test probe.

During testing, the flat bottom face 15 of the test module housing is placed on the top surface of the integrated circuit package 19. The housing is rigidly held in contact with the package in a manner described below. The test probes 20 are arranged on the housing in a fixed pattern that matches the pattern of contacts 19a on the package under test or the pattern of test points on the circuit board that carries the integrated circuit packages. Electrical test signals from the electronic test analyzer are then applied to the pins 29 in the connector 28 at the edge of the flex circuit 14. The pins 29 in the connector 28 are electrically connected to corresponding circuit traces of the flex circuit 14, preferably by soldering techniques. The electrical test signals travel along the circuit traces on the flex circuit 14 and are communicated to corresponding conductive barrels 22 in the housing 12 which are electrically connected to the circuit traces by the physical connection from the press fit of the barrel in each bore in the housing. Close tolerances between the inner diameter of the barrels 22 and the outer diameter of the test probes 20 provide a sliding contact that produces a corresponding electrical contact from the barrel to the test probe along the length of the barrel. The electrical test signals are then communicated to the leads of the integrated circuit 19 through the tips of the test probes 20. The electrical test signals then travel through the integrated circuit to other leads of the integrated circuit where they are then communicated to other test probes 20. In the reverse direction, the electrical test signals are communicated from the test probes 20 through the barrels 22, along the passive circuit traces of the flex circuit 14 to corresponding pins in the connector where they are communicated to the electronic test analyzer.

After testing, the translator module 10 is removed from the integrated circuit package, thereby releasing the pressure of the test probes against the leads of the integrated circuit package. The head of the test probe is urged in response to the elastic shrinking of the diaphragm toward the housing, thereby allowing the diaphragm to return to its pre-test condition.

Figure 3:
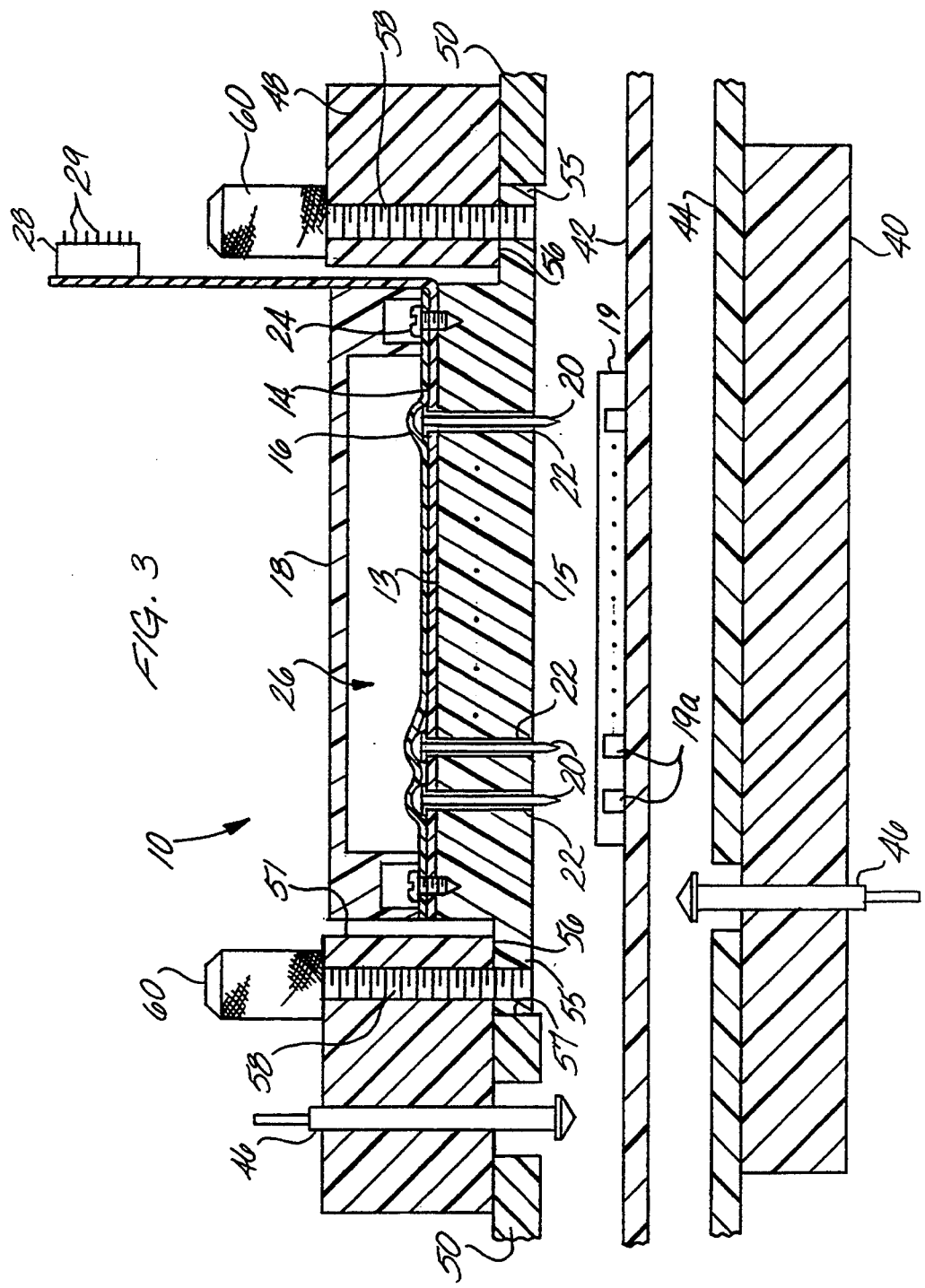
FIG. 3 is a cross sectional view illustrating a test fixture for testing a populated circuit board using the translator module of FIGS. 1-2 for testing integrated circuit packages on the board.

FIG. 3 is a cross sectional view illustrating a test fixture for testing a populated circuit board using the translator module of FIGS. 1-2 for testing integrated circuit packages mounted on the board.

The test fixture has a lower probe plate 40 spaced below and substantially parallel to a circuit board 42 to be tested. A lower stripper plate 44 is mounted against the top surface of the lower probe plate 40. Both the lower stripper plate 44 and the lower probe plate 40 have a plurality of separate bores drilled in a matching pattern corresponding to the pattern of the test points on the lower surface of the circuit board 42 under test. Separate spring probes 46 are mounted in each of the bores (only one test probe 46 is shown in the lower probe plate for simplicity). Each spring probe 46 can be the type having a cylindrical receptacle, an internal coil spring inside the receptacle, and a plunger movable in the receptacle under the bias of the spring. The probes 46 can be wired to a remote interface connector (not shown) in the well known manner for making electrical connections to the external electronic test analyzer. The probes 46 are press fitted into the bores in the lower probe plate 40. The lower stripper plate 44 is a spacer that prevents the spring probes from bottoming out by stopping the plunger from fully compressing the coil spring against the bottom of the receptacle. The circuit board contacts the lower stripper plate 44, thereby preventing further movement of the plunger against the coil spring.

Similar to the lower stripper plate 44 and the lower probe plate 40, an upper probe plate 48 is spaced above the top surface of the circuit board 42 under test. An upper stripper plate 50 is mounted against the bottom surface of the upper probe plate 48. Both the upper stripper plate 50 and the upper probe plate 48 have a plurality of separate bores drilled in a matching pattern corresponding to the pattern of the test points on the upper surface of the circuit board under test. Similar to the lower probe plate 40, separate spring probes 46 are mounted in the bores in the upper probe plate 48. (Only one test probe 46 is shown in the upper probe plate for simplicity.)

The upper and lower probe plates and the upper and lower stripper plates are made of a sturdy, rigid electrically insulating material, such as G-10 fiberglass.

The upper stripper plate 50 and the upper probe plate 48 have a plurality of mounting holes for receiving corresponding test modules inserted into the mounting holes for alignment with corresponding integrated circuit packages on the board below each test module. As shown in FIG. 3, a mounting hole 51 in the upper probe plate spans the outer periphery of the test module housing. A lower flange 55 projects outwardly at the base of the test module housing and rests against a downwardly facing annular shoulder 56 on the probe plate above an oversized mounting hole 57 in the upper stripper plate. The translator module 10 is inserted into the upper probe plate 48 from the bottom side. The shoulder 56 and the flange 55 have a plurality of aligned mounting holes preferably located in the four corners of the shoulder and flange. Threaded fasteners disposed in the mounting holes are fastened in place by corresponding retaining nuts 60 for holding the translator module 10 in the mounting holes in the upper probe plate 48 and the upper stripper plate 50.

The test probes 46 are separately wired (not shown for clarity) to a system interface connector (also not shown for clarity) for connection to the external test analyzer by conventional wire wrapping (not shown). Alternatively, the spring probes 46 may be connected to separate flex circuits (not shown) mounted on the upper and lower probe plates for translating test signals from the spring probes 46 to a system interface connector (not shown). The connector 28 of the translator module 10 is similarly electrically connected to the system interface connector by wire wrapping a wire between the two connectors. Alternatively, the inter-connection between the connector 28 and the system interface connector may be a flex circuit.

In the test fixture, the spring probes 46 are aligned for contact with corresponding test points on the circuit board, and the probes 20 on the translator module 10 are aligned for contact with corresponding leads 19a of each integrated circuit package 19 on the circuit board. By using the translator module in fixtures containing spring probes, good electrical contact may be achieved by the solid pins 20 for the closer spacing of the leads of the integrated circuit package.

A peripheral gasket (not shown) on the top surface of the lower stripper plate 44 encloses the array of lower test probes 46 and the circuit board. The circuit board 42 is placed on the array of spring probes 46 in the lower probe plate 40. The upper stripper plate 50 is moved into contact with the gasket to form a pressure seal between the bottom side of the upper stripper plate 50 and the top side of the lower stripper plate 44. During use, air is drawn from a hollow interior space or volume between the upper and the lower stripper plates, which causes the outside atmospheric pressure to apply a force against the upper stripper plate, thereby moving the plate in a downward direction. The force applied by the air pressure difference compresses the upper stripper plate against the gasket until the circuit board contacts an array of board stops (not shown). This travel of the board forces the board to move into contact with the tips of the spring probes in the upper and lower probe plates, while the board moves toward the test pins 20 in the translator modules. This forces the test probes 20 upwardly in the translator module toward the lower face of the diaphragm 16. Contact from the moving probes 20 stretches the elastic diaphragm upwardly into the cavity 26 in the housing cover 18. The tension in the stretched diaphragm resists the upward force of each test probe 20 with an equivalent counter-force acting axially on the probes to hold the probes in spring-biased pressure contact with the leads or test points on the integrated circuit or board under test.

In a manner similar to that described for the embodiment illustrated in FIGS. 1-2, electrical test signals are applied by the electronic test analyzer to the springs probes 46, while in parallel, the electrical test signals travel through the probes in the translator module to the leads of the integrated circuit package or the test points on the board under test.

In an alternate embodiment of the test fixture described in FIG. 3, fluid actuation is used for applying a spring force to the test probes in the translator module. In this embodiment, the diaphragm 16 is placed across the cavity 26 in the housing cover 18 to form an air chamber above the diaphragm. The housing cover 18 is mounted to the top portion of the housing 12 so that the bottom face of the cover sandwiches the diaphragm between the face and the flex circuit 14 on the top of the housing. This forms a continuous air-tight seal around the periphery of the enclosed cavity. The peripheral seal is preferably arranged to hold the diaphragm in a substantially immovable rest position against the fixed top surface of the flex circuit and the heads of the test probes. An air hose (not shown) from an air pump (not shown) is connected to orifices in the cover located at the top of the cavity.

Operation of the vacuum test fixture is similar to that described above for the fixture of FIG. 3. During electrical testing, the circuit board is placed on the peripheral gasket as described above. As a vacuum is drawn from the volume inside the gasket seal, the atmospheric pressure against the circuit board compresses the board against the gasket and draws the circuit board into contact with the test probes 20 in the test module. The circuit board is pushed against the tips of the test probes, thereby pushing the heads of the test probes into the diaphragm 16, which stretches the diaphragm and thereby creates a resisting downward axial force on each test probe with an equivalent counter-force. At the same time, air is forced into the cavity 26, causing the elastomeric diaphragm to push axially downwardly against the test probes 20 which, in turn, apply a spring-biased force against the leads adjacent the integrated circuit package on the circuit board. As the air pressure inside the cavity is increased, the diaphragm applies a progressively greater spring-biased force to the individual test probes 20. The air is continuously forced into the interior space of the cavity during testing of the circuit board.

When the air pressure inside the cavity 26 reaches an equilibrium where it is not changing during test, the pressure at each point along the surface of the diaphragm 16 is constant. The force applied against each test probe 20 by the uniform pressure on the diaphragm 16 is also equal. This force is substantially independent of the displacement of the probe into the diaphragm 16 because the pressure is equal at each point of the diaphragm. The spring rate of the diaphragm is low. The elastic properties of the diaphragm material and the air pressure are the principal factors influencing force on the probes from diaphragm deflection. The distance of probe travel does not have a substantial effect on probe force.

In a manner similar to that described in the embodiment illustrated in FIG. 3, electrical test signals are applied by the electronic test analyzer to the test fixture and the fluid activated test module.

Figure 4:
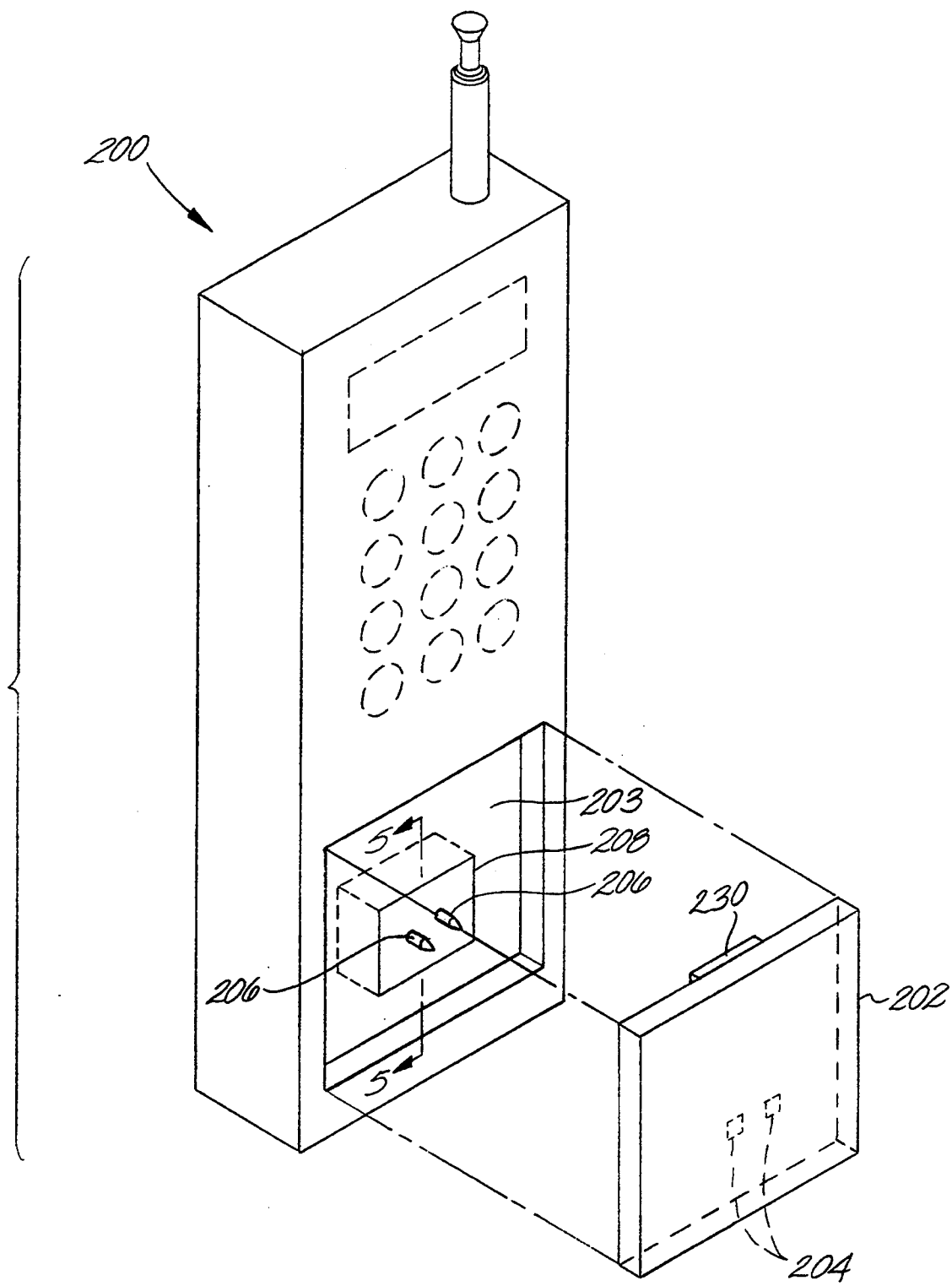
FIG. 4 is an exploded perspective view of the rear side of a portable cellular telephone and a battery.
Figure 5:
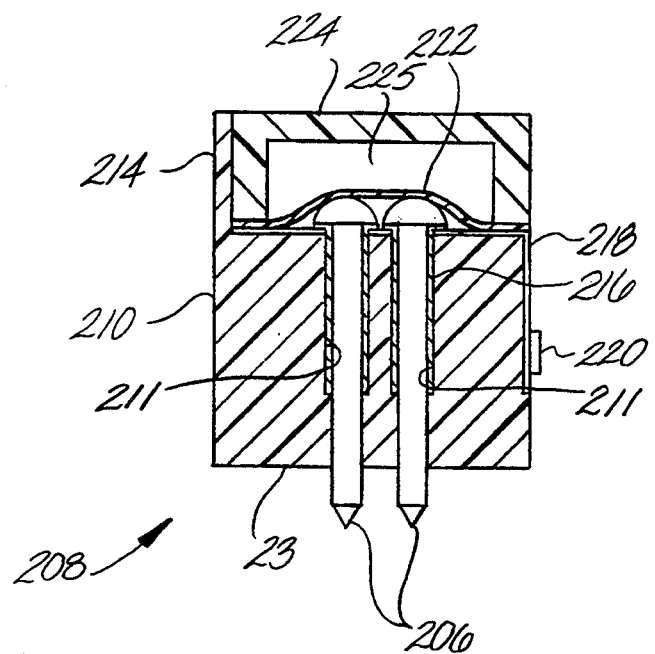
FIG. 5 is an inverted cross sectional view taken on line 5—5 of FIG. 4 of a connector for the battery interface of the portable cellular telephone.

FIGS. 4 and 5 illustrate one example of an alternative use of the invention exclusive of the testing of circuit boards. This embodiment shows a portable cellular telephone 200 having a battery pack 202 installed in a recess 203 on a rear side of the cellular telephone for supplying electrical power for the operation of the telephone. Battery voltage terminals 204 on a rear side of the battery pack electrically contact corresponding spring biased telephone voltage terminals 206 on the rear side of the telephone 200 when the battery is installed in the telephone. The spring biased terminals 206 are on a connector 208 of this invention installed in the body of the telephone.

The connector 208 containing the telephone voltage terminals 206 is located on the lower rear side of the telephone 200. Referring to FIG. 5, the connector 208 has a housing 210 having a generally rectangular cross sectional shape. An arm 214 projects up from a top side of the connector, perpendicular to the connector's top face. The housing 210 is made of a solid unitary piece of a sturdy, rigid electrically insulating material, such as G-10 fiberglass. Similar to the housing of the translator module described above in FIGS. 1–2, the housing 210 has a plurality of separate bores 211 drilled on a fixed pattern through the depth of the housing and opening to the top and bottom faces of the housing. The bores 211 are drilled in a pattern corresponding to the pattern of terminals 204 on the battery pack. An electrically conductive barrel 216 is press fitted into each bore.

A flex circuit 218 having a right-angle shape is laminated to the top face and an exterior side wall of the housing 210. Each barrel 216 has a flange that pierces a circuit trace on the flex circuit and seats the flange to the circuit trace to form an electrical connection. The flex circuit 218 has electrically conductive traces that connect each barrel 216 on the top face of the housing 210 to a corresponding telephone voltage terminal 220 on the portion of the flex circuit on the exterior side wall of the housing.

The spring biased terminals 206 are solid pins movable axially in each of the barrels. Similar to the test module 10 described above in FIGS. 1-2, the pins are movable on the inside of the barrels 216 for making sliding electrical contact. The pins 206 have a sharp tip on an end projecting away from a bottom face 223 of the housing 210. A round head on the opposite end of each pin projects from a top face of the housing.

A thin, flexible elastomeric diaphragm 222 is held taut against the top surface of the flex circuit 218 so that the bottom face of the diaphragm is in contact with the round heads of the pins 220. The diaphragm 222 is mounted to the housing 210 by fasteners (not shown) in a manner similar to the translator module 10 described above. Alternatively, the diaphragm 222 may be bonded at its periphery to the housing 210. A housing cover 224 of rectangular configuration with a downwardly opening rectangular recess 225 is mounted to the top face of the housing 210 so that the peripheral lower wall of the cover contacts the top face of the housing. A ring shaped shield (not shown) optionally contacts the bottom face of one side of the housing to surround the projecting end portions of the pins 206. The shield can serve as a locator for a separate electrical device that plugs into the shield for current with the pins exposed within the shield.

In a manner similar to the test module 10, the diaphragm 222 provides a spring force against the heads of the pins 206 in response to axial pressure on the tips of the pins. The connector 208 is installed in the telephone with the terminals 220 making surface mount contact with a circuit board (not shown) in the telephone. When the battery pack is installed in the recessed region at the rear face of the telephone, the terminals 204 on the battery are pressed into contact with the spring biased pins 206. The terminals 204 push against the tips of the pins 206 to thereby urge the heads of the pins into the diaphragm 222 in response to the axial force on the pins. As the heads are urged into the diaphragm, the diaphragm stretches to thereby generate an equal and opposite axial force on the pins. This produces a good spring biased contact between the pins and the terminals on the battery pack. This spring biased connection is retained by the battery pack latching to the recessed region on the telephone by a latch 230 on the battery pack. The connector 208 provides an inexpensive means of making spring biased contact for the electrical connectors when the battery pack is repeatedly removed and re-installed in the housing.

In alternate embodiments, the battery may be used in any electronic or electrical device that operates on batteries requiring frequent removal and reinstallation. In other embodiments, the connector may be used in portable electronic notebooks for connecting to removable memory modules that plug into the notebook. In still further embodiments, the connector is used in electronic devices that are inserted into a battery charger for electrically connecting the electronic device to the recharger.

What is claimed is:

1. A test module for making contact with a fixed pattern of spaced apart leads adjacent an integrated circuit package mounted among other electrical circuit elements on a loaded printed circuit board, to perform circuit verification by an external electronic test analyzer, the test module comprising:

a rigid probe support member having top and bottom sides;

a plurality of elongated and spaced apart test probes extending through a fixed pattern of respective bores in the probe support member to slidably support the probes in a pattern corresponding to the pattern of leads adjacent the integrated circuit package, the test probes comprising solid metal pins projecting from the bottom side of the probe support member on said fixed pattern so that a projecting first end of each supported test probe is aligned for contact with a corresponding lead adjacent the integrated circuit package, an opposite second end of each supported test probe having means for retaining the probe in said probe support member, the second end of each probe facing away from the top side of the probe support member and away from the integrated circuit package;

a flexible elastic diaphragm having a first face and a second face, the diaphragm mounted on the probe support member so the first face of the diaphragm is normally supported by the top side of the probe support member, the diaphragm thereby contacting the second ends of the test probes, and in which the second face of the diaphragm faces toward a void space into which the diaphragm is elastically movable away from the top side of the probe support member in response to axial pressure contact from the second ends of the test probes caused by the test probes sliding within their respective bores when the test module is mounted over the integrated circuit package and the first ends of the test probes are pressed into contact with the leads adjacent the integrated circuit package, thereby freely stretching the flexible diaphragm into the void space away from the probe support member and holding the stretched diaphragm under tension and in spring biased pressure contact with the second ends of the test probes to resiliently force each test probe axially against a respective lead adjacent the integrated circuit package; and connecting means supported by said probe support member for electrically connecting said test probes to corresponding electrical terminals on the test module so that contact between the individual leads adjacent the integrated circuit package and corresponding test probes on the module is electrically translated via the test probes to the external electronic test analyzer through its contact with the terminals on the test module.

2. The test module of claim 1 wherein the test module comprises a conductive barrel in each bore, and the solid metal pins are in contact with the barrels.

3. The test module according to claim 1 wherein the connecting means comprises a flex circuit on the top side of the probe support member and having circuit traces communicating with corresponding test probes, the circuit traces on the flex circuit extending away from the probes along the probe support member into a peripheral region of the probe support member for transmitting test signals to the terminals on the test module.

4. The test module according to claim 3 in which the pins have leads in contact with the top side of the probe support member to normally hold them in a fixed position in the bores, and in which the diaphragm is normally in a stretched and tensioned position contacting the leads of the pins.

5. The test module according to claim 1 further comprising a rigid cover mounted over the second face of the diaphragm and in which the void space comprises a cavity formed within the cover above the diaphragm, the diaphragm being movable into the cavity when the diaphragm elastically moves away from the top side of the probe support member.

6. A test fixture for testing an integrated circuit package mounted among other electrical circuit elements on a loaded printed circuit board, said testing comprising circuit verification via an external electronic test analyzer, the test fixture comprising:

a test module having a rigid support plate having top and bottom sides, the support plate disposed adjacent and substantially parallel to the circuit board for releasable mounting over the integrated circuit package, a plurality of elongated and spaced apart test probes each extending axially through and being slidable in a respective bore in the support plate to support the probes in a pattern corresponding to a pattern of leads adjacent the integrated circuit package, the test probes comprising solid metal pins having first and second ends, the first ends of the test probes projecting from the bottom side of the support plate for alignment with said pattern of leads, means for supporting the circuit board and the support plate to be mutually spaced apart and substantially parallel so that the first end of each test probe is aligned for contact with a respective lead adjacent the integrated circuit package, the second end of each test probe retaining the test probe in the support plate and facing away from the support plate and away from the circuit board, a thin, flexible, fluid impervious elastic diaphragm having a first face and a second face, the diaphragm mounted on the support plate so the first face of the diaphragm is normally supported by the top side of the support plate and in contact with the second ends of the test probes, and in which the second face of the diaphragm faces toward a void space into which the diaphragm is elastically movable in response to the probes sliding axially, means for providing relative movement between the leads adjacent the integrated circuit and the test probes to thereby move the second ends of the probes toward the diaphragm, the diaphragm being elastically movable away from the support plate in response to axial pressure contact from the second ends of the test probes caused by the first ends of the test probes being pressed into contact with the leads adjacent the integrated circuit, thereby freely stretching the flexible diaphragm into the void space away from the support plate and holding the stretched diaphragm under tension and in spring biased pressure contact with the second ends of the test probes to resiliently force each test probe axially against a respective lead adjacent the integrated circuit package, and connecting means supported by the probe support plate for electrically connecting said test probes to corresponding electrical terminals on the test module so that contact between the individual leads adjacent the integrated circuit package and corresponding test probes on the test module is electrically translated via the test probes to the external electronic test analyzer through its contact with the terminals on the test module.

7. A test fixture according to claim 6 in which the connecting means comprise a translator circuit on the support plate and having passive circuit traces communicating with corresponding test probes, the circuit traces extending away from the probes to said terminals for transmitting test signals to the external electronic test analyzer.

8. A test fixture according to claim 6 in which the fixture includes a probe plate carrying spring biased test probes for contact with circuits on the board and a mounting hole for receiving the test module to mount the test module in alignment with an integrated circuit package on the board.

9. A test fixture according to claim 6 in which the test module includes a conductive barrel in each bore, and the solid metal pins are in contact with the barrels.

10. The test fixture according to claim 6 in which the connecting means includes a flex circuit in the film sheet form on the upper side of the support plate having circuit traces communicating with respective test probes, the circuit traces on the flex circuit extending away from the test probes along the probe support plate for transmitting test signals to the terminals of the test module.

11. The test fixture according to claim 10 in which the second ends of the probes have head portions in contact with the top side of the support plate to normally retain the probes in a fixed position in the bores, and in which the diaphragm is held in the stretched and tensioned position from pressure contact with the head portions of the probes.

12. A test module for making contact with a fixed pattern of spaced apart electrical contacts adjacent an integrated circuit package mounted on a circuit board to perform circuit verification by an external electronic test analyzer, the test module comprising:

a rigid probe support member having top and bottom sides;

a plurality of test probes comprising solid metal pins slidably supported in the probe support member for alignment with the contacts adjacent the integrated circuit package, the test probes having first ends projecting from the bottom side of the support member for contact with the contacts adjacent the integrated circuit package, the test probes having opposite second ends adjacent the top side of the probe support member;

means for translating test signals from the test probes to the exterior of the test module comprising a thin electrically insulative sheet supported by the top side of the probe support member and having separate electrically conductive leads on the sheet electrically connected to corresponding test probes in the probe support member, the conductive leads extending on the sheet to terminals on the exterior of the test module, and a thin, flexible elastic diaphragm having a first face and a second face, the first face of the diaphragm overlying the electrically insulative sheet with the second ends of the test probes normally disposed for pressure contact with the first face of the elastic diaphragm, the opposite second face of the elastic diaphragm facing a freely open void space into which the diaphragm is elastically movable away from the top side of the probe support member in response to axial pressure contact from the second ends of the test probes caused by the first ends of the test probes being pressed into contact with the contacts adjacent the integrated circuit package, thereby freely stretching the flexible diaphragm into the void space and holding the stretched diaphragm under tension and in spring biased pressure contact with the second ends of the test probes to resiliently force each probe axially against a respective contact aligned with the test probe, such that contact between the individual contacts adjacent the integrated circuit package and corresponding test probes in the module is electrically translated by the electrical leads carried on the electrically insulative sheet to the terminals on the exterior of the test module for connection to the external electronic test analyzer.

13. Apparatus according to claim 12 in which the electrical leads on the electrically insulative sheet extending to the exterior of the test module comprise flexible circuit traces on a thin flexible plastic sheet.

* * * * *